United States Patent [19]

Coveley

[11] Patent Number: 5,438,699

[45] Date of Patent: Aug. 1, 1995

[54] ADAPTIVE SYSTEM FOR SELF-TUNING A RECEIVER IN AN RF COMMUNICATION SYSTEM

[76] Inventor: Michael Coveley, Suite 101, Passy #16, York University, M. York, Ontario, M3J 3L3, Canada

[21] Appl. No.: 195,026

[22] Filed: Feb. 14, 1994

Related U.S. Application Data

[63] Continuation-in-part of Ser. No. 895,593, Jun. 9, 1992, abandoned.

[51] Int. Cl.⁶ .............................................. H04B 17/00
[52] U.S. Cl. ..................................... 455/67.4; 455/63; 455/70; 455/186.1; 455/193.2; 455/193.3; 455/226.1
[58] Field of Search ........................ 455/63, 67.1, 67.4, 455/68, 70, 71, 88, 182.3, 184.1, 185.1, 186.1, 193.1, 193.2, 193.3, 195.1, 197.2, , 336, 215, 50.1, 67.3, 296, 226.1

[56] References Cited

U.S. PATENT DOCUMENTS

| | | | |
|---|---|---|---|
| 3,671,868 | 6/1972 | Saunders | 455/336 |
| 4,210,898 | 7/1980 | Betts | 455/99 |
| 5,077,783 | 12/1991 | Leppanen | 455/67.4 |
| 5,105,162 | 4/1992 | Fleissner et al. | 455/336 |
| 5,115,515 | 5/1992 | Yamamoto et al. | 455/71 |
| 5,146,613 | 9/1992 | Anderson | 455/78 |
| 5,201,063 | 4/1993 | Tam et al. | 455/67.4 |
| 5,230,091 | 7/1993 | Vaisanen | 455/67.4 |
| 5,313,656 | 5/1994 | Vaisanen et al. | 455/67.4 |

*Primary Examiner*—Edward F. Urban
*Assistant Examiner*—Nguyen Vo
*Attorney, Agent, or Firm*—Sim & McBurney

[57] ABSTRACT

A system for adaptive self-tuning of a receiver in a radio communication system. Prior to transmission of each data package from a transmitter to a receiver, the transmitter generates a sequence of predefined test bytes (test sequence) n times. An identical version of the predefined test sequence is stored in the receiver. Circuitry is provided in the receiver for selected predefined states of tuning impedances for varying the center operating frequency of the receiver, wherein the predefined states of tuning impedances are equal in number to the predefined number of test sequences. A microcontroller in the receiver compares the received test sequence with the stored test sequence and creates a tuning table correlating respective states of the receiver tuning impedances with error bits detected in each state. The microcontroller then selects the tuning impedance state characterized by the least number of error bits, thereby selecting the optimal receiver central operating frequency to the carrier frequency generated by the transmitter.

9 Claims, 7 Drawing Sheets

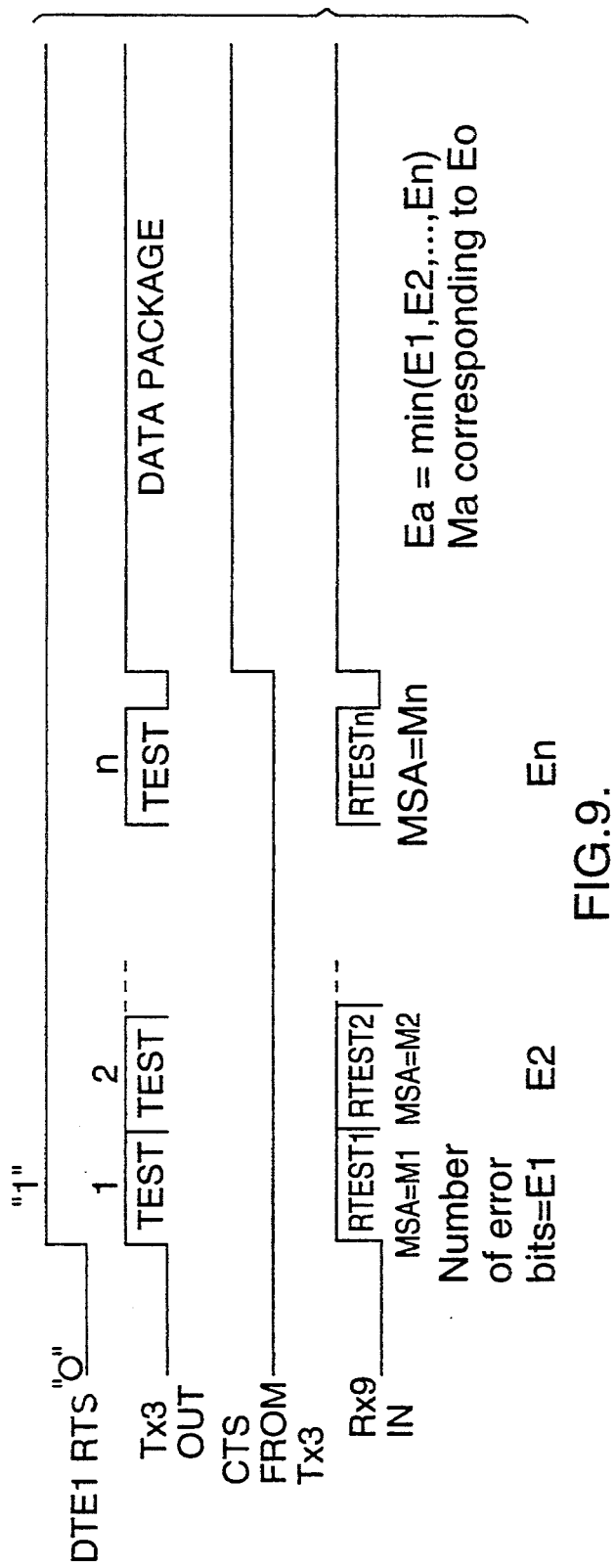

ADAPTIVE SYSTEM FOR SELF-TUNING A RECEIVER IN AN RF COMMUNICATION SYSTEM

CROSS REFERENCE TO RELATED APPLICATION

This is a continuation-in-part of application Ser. No. 07/895,593 filed Jun. 9, 1992, entitled HYP-77/87 MICRO TRANSMITTER 7 HYP-300 HYPEREGENERATIVE RECEIVER.

FIELD OF THE INVENTION

This invention relates in general to communication systems, and more particularly to a system for real-time automatic self-tuning of a receiver to a transmitter carrier frequency.

BACKGROUND OF THE INVENTION superegenerative radio frequency techniques are well known in the art of radio communication. Systems operating in accordance with superegenerative radio frequency techniques continue to be manufactured in extremely large quantities for serving a variety of short range RF applications. The popularity of such regenerative radio frequency techniques is due primarily to simplicity of design and low manufacturing costs. Examples of superegenerative radio frequency systems may be found in U.S. Pat. Nos. 3,671,868 (Saunders); 5,146,613 (Anderson) and 4,210,898 (Betts).

However, superegenerative radio systems are subject to frequency drift and unrestrained bandwidth problems as a result of environmental changes and the aging of components within the radio circuitry. This often results in undependability of the systems and potentially critical deficiencies within relatively short periods of duty.

A further prior art superegenerative receiver is disclosed in U.S. Pat. No. 5,105,162 (Fleissner et al). In this Patent, a system is provided for automatically tuning the centre operating frequency of the receiver prior to production. In Fleissner et al, a signal generator and spectrum analyzer are used to permanently set the receiver to the desired centre operating frequency.

Thus, Fleissner et al provides an electronically locked tuning frequency as contrasted with prior art mechanically locked systems such as epoxied inductor cores, spring loaded capacitor/resistor barrels, etc. Once the centre operating frequency of the receiver has been permanently set, ageing components and temperature changes in the receiver will eventually result in the well known dependability problems of the prior art superegenerative receivers discussed above.

SUMMARY OF THE INVENTION

According to the present invention, a system is provided for real time automatic self-tuning of the receiver for optimal reception with respect to the carrier frequency of an associated transmitter. The system of the present invention is adaptive in that self-tuning of the receiver center operating frequency is effected prior to each transmission of an information signal by the transmitter. Thus, the system of the present invention overcomes the prior art disadvantages of receiver center operating frequency drift due to component ageing and temperature changes over time. Furthermore, the system of the present invention allows for signal reception from transmitters having slightly different carrier frequencies since the system provides for self tuning of the receiver prior to each transmission.

In accordance with a general aspect of the invention, the transmitter generates and transmits a predetermined number n of test sequences prior to each data transmission. The receiver incorporates a controller for storing an identical test sequence and circuitry for selecting between a like number of tuning impedances for tuning the receiver to receive the test sequences generated by the transmitter at respective slightly different center operating frequencies set by the tuning impedances. The controller in the receiver then compares the received test sequences with the stored test sequence and calculates the number of bit errors for each test sequence. A table is created in the controller for correlating the bit errors with the associated selected tuning impedances, and the tuning impedance which is characterized by the least number of bit errors is selected for establishing the receiver center operating frequency which is closest to the transmitter carrier frequency.

In one embodiment of the invention, the transmitter and receiver are combined in the form of a transceiver. In a second embodiment of the invention, the transmitter and receiver are separate.

The tuning impedances may be realized using any of a number of well known arrangements of components. For example, a plurality of inductors may be connected in parallel with the primary tuning inductor of the superegenerative receiver in a plurality of configurations by means of a switch array. In another embodiment, the impedances may be set by means of a tuning voltage applied to a varactor diode connected in parallel with the primary tuning capacitor. In a further embodiment a plurality of resistors may be connected in various configurations via a switch array in parallel with an LC tuning circuit of the superegenerative receiver. Other tuning impedance configurations are possible as discussed in greater detail below.

BRIEF DESCRIPTION OF THE DRAWINGS

A detailed description of the preferred embodiment is provided in detail below with reference to the following drawings, in which:

FIG. 9 is a timing diagram showing operation of a transmitter and receiver according to the principles of the present invention;

FIG. 10 shows the contents of a tuning table of bit errors and associated tuning impedance states in accordance with the present invention;

DETAILED DESCRIPTION OF THE INVENTION

Figure 1:
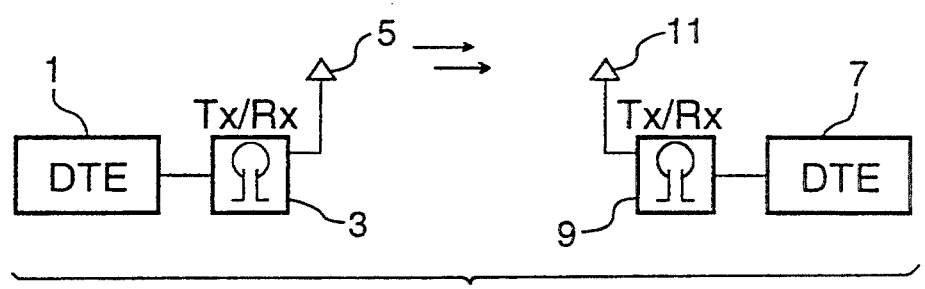
FIG. 1 is a block diagram of a transmitter and receiver adapted to implement the system of the present invention.

Turning to FIG. 1, a radio communication system is shown comprising a data terminal I connected to a transceiver 3 for transmitting and receiving radio frequency (RF) signals via an associated antenna 5. At a remote location, an associated data terminal 7, transceiver 9 and antenna 11 are provided.

Asynchronous serial communication is established between each of the data terminals 1 and 7, and the associated transceivers 3 and 9, respectively, (e.g. via RS-232 protocol). In the preferred embodiment of FIG. 1, data terminals 1 and 7 and transceivers 3 and 9 are of substantially identical construction so that bi-directional communication may be established therebetween. However, as discussed in greater detail below, the principles of the present invention apply equally to a system comprising a transmitter at one location and a receiver at another location. Indeed, the principles of the present invention also apply to a single transceiver and associated data terminal and antenna configured to operate as a transponder so that the transmitter portion of the transceiver generates and transmits a data signal which may be reflected off of a tag or other suitable means (with or without frequency shifting) and returned for reception via the receiver portion of the transceiver.

Figure 2:
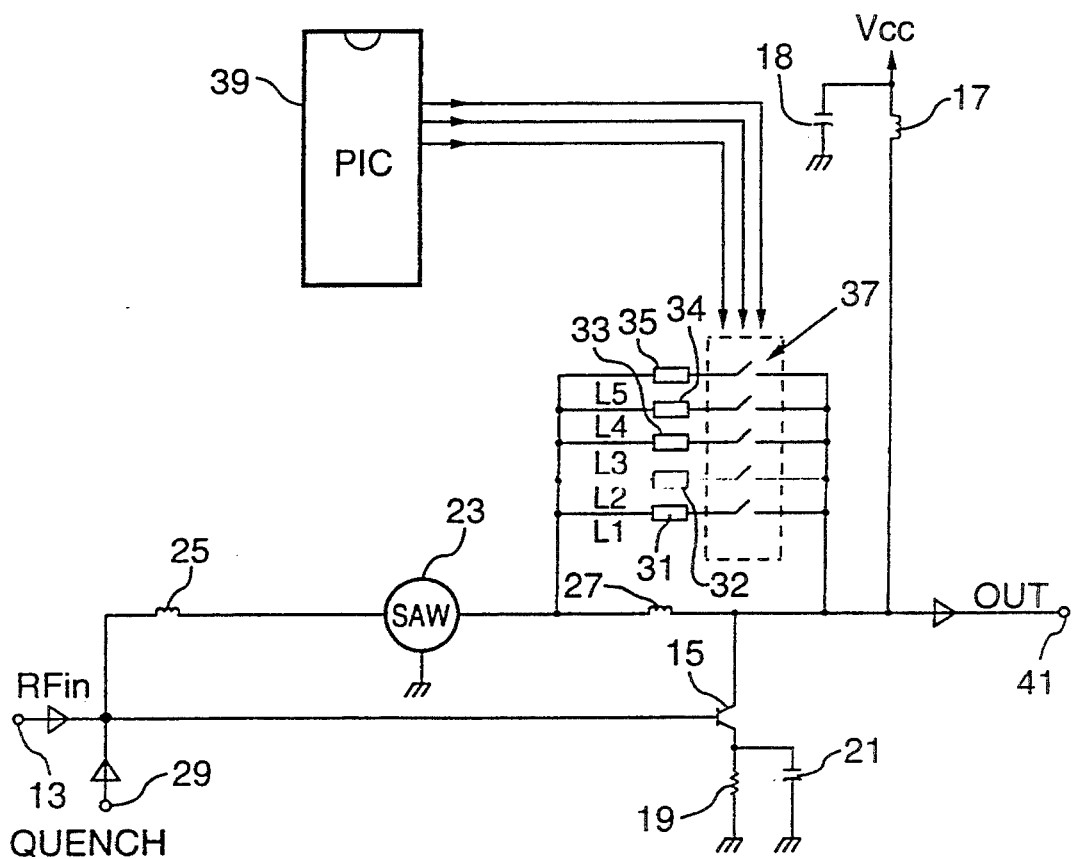
FIG. 2 is a block schematic diagram of an inductive adjustable configuration of the receiver according to a first embodiment of the invention.

The superegenerative receiver portion of each of the transceivers 3 and 9 is shown in greater detail with reference to FIG. 2.

A modulated $RF_{in}$ signal is received on an input 13 and is applied to the base of a transistor 15 connected in common emitter configuration. A collector terminal of transistor 15 is connected to a DC supply voltage Vcc via an inductor 17, and an emitter terminal thereof is connected to ground via an emitter biasing resistor 19 and also via an emitter bypass capacitor 21 for providing improved bias stability. A capacitor 18 is provided for filtering power supply noise.

A surface acoustic wave (SAW) device 23 is connected in a feed-back loop to the base terminal of transistor 15 via an inductor 25 and to the collector terminal of transistor 15 via an inductor 27. The SAW device 23 is used in a well known manner for providing low loss, temperature stable phase shift in the feedback circuit to cause oscillations, as discussed in greater detail below.

A QUENCH oscillation signal is received on a further input terminal 29 for application to the base of transistor 15.

In order to provide real time adjustable tuning of the receiver, a plurality of further inductors 31, 32, 33, 34, and 35 are connected via a microswitch array 37 in parallel with inductor 27. Inductors 31-35 are characterized by respective inductances L1-L5 for effecting fine tuning of the default centre operating frequency set by inductors 25 and 27 in the feedback circuit of transistor 15. A microcontroller 39 in the form of a programmable integrated circuit (PIC) provides control signals for causing the microswitch array 37 to connect all n possible parallel combinations of inductors 31-35 with inductor 27 (e.g.) ($n=2^5{}^6=32$ different states for five switches of array 37).

In operation, inductors 25 and 27 are chosen so that the feedback circuit comprising transistor 15, inductors 25 and 27 and the SAW device 23, begins oscillating at a frequency close to the desired default center operating frequency when the QUENCH voltage is applied to the circuit via terminal 29. Upon receipt of the modulated $RF_{in}$ signal on input terminal 13, the signal due to the QUENCH voltage at the base of transistor 15 increases causing the transistor 15 to oscillate at a higher frequency. Each time the transistor 15 is enabled with each cycle of the QUENCH signal, the modulated $RF_{in}$ signal voltage is superimposed on the QUENCH voltage signal and is coupled to an output terminal 41. As discussed in greater detail below with reference to FIG. 12, envelope detectors, low frequency amplifiers and low pass filters are then used to demodulate the received signal.

The above discussion of operation of the oscillating circuitry provided by transistor 15, SAW device 23 and the inductors 25 and 27, does not represent a departure from the operation of prior art superegenerative receivers. However, as will be discussed in greater detail below, the operation of microcontroller 39 and microswitch array (MSA) 37 for self-tuning the receiver center operating system, is new.

Figure 12:
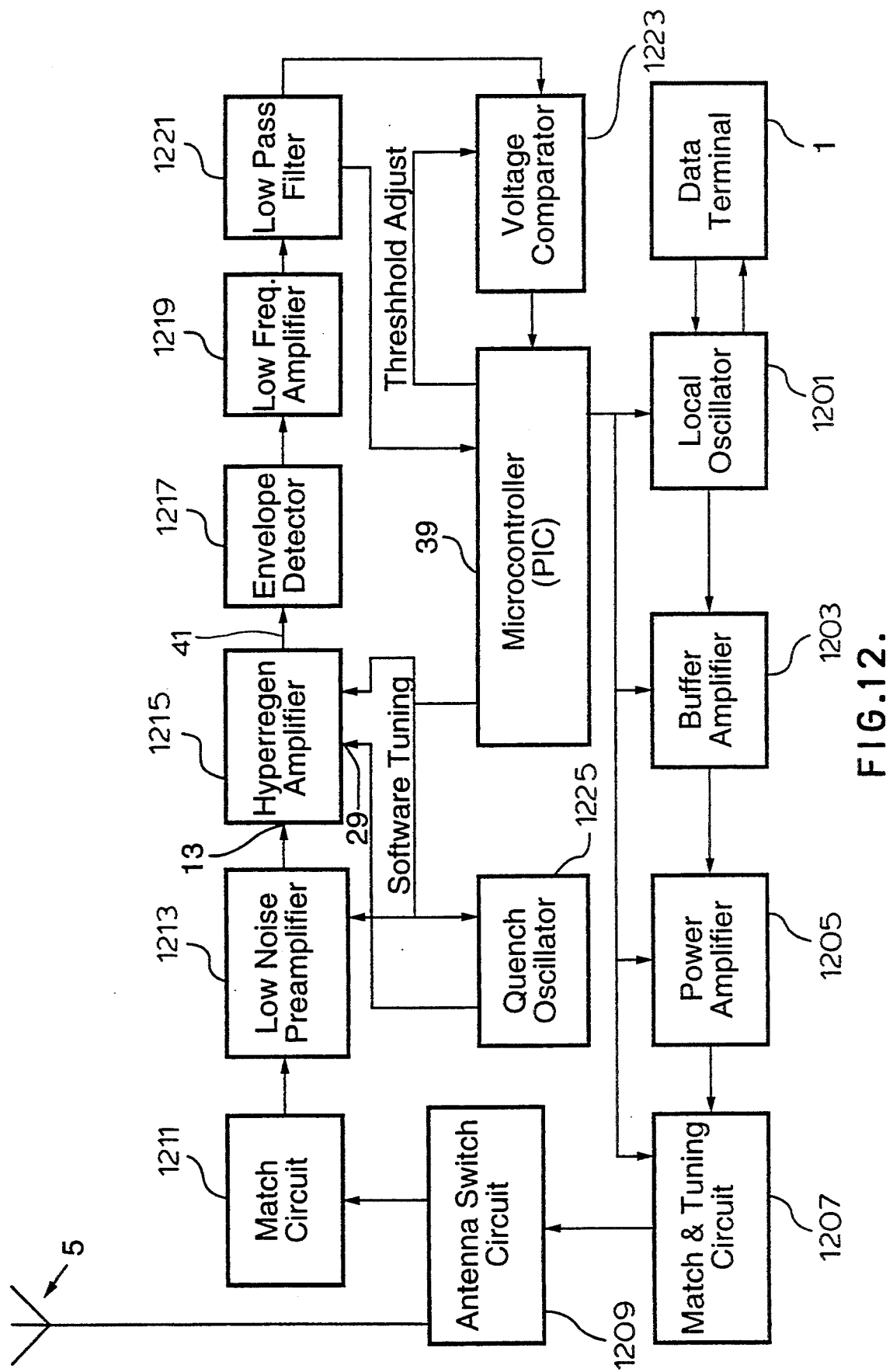
FIG. 12 is a block diagram of a transceiver according to the preferred embodiment of the present invention.

Turning briefly to the block diagram of FIG. 12, the internal structure of transceiver 3 is shown in greater detail. The structure of transceiver 9 is identical to that of transceiver 3.

Considering the "transmit" portion of the transceiver shown in FIG. 12, a SAW resonator (not shown) provides a carrier frequency in local oscillator 1201. A buffer amplifier 1203 isolates the local oscillator from the output power amplifier 1205. Output power amplifier 1205 amplifies the signal from buffer amplifier 1203 to a predetermined level capable of driving the antenna 5, in conjunction with a tuning and matching circuit 1207, when antenna switch 1209 switches antenna 5 to the transmit side of the transceiver.

The data stream of information to be transmitted is established via microcontroller 39 along with the destination address. Once real-time transmission is completed, the microcontroller 39 reverts to a sleep-mode or idle-loop which places the entire device into an extremely low quiescent current state for minimizing power consumption to less than 10 mA, so that a power switch is not required.

Turning to the "receive" portion of the transceiver, a signal received via antenna 5 is switched via antenna switch circuit 1209 to a matching and tuning network 1211. The received signal is amplified by a low noise high frequency preamplifier 1213 for increasing the signal-noise-ratio and for preventing superegenerative oscillation radiation. The hyperegenerative amplifier 1215 includes all of the components illustrated in FIG. 2 with the exception of microcontroller 39, and the superegenerative operating technique of amplifier 1215 is as discussed above with reference to FIG. 2.

Envelope detector 1217 recovers the modulated signal output from the selected center operating frequency by means of a hot carrier diode (not shown) in a well known manner. A combination of low frequency amplifier 1219 and low pass filter 1221 then amplifies the demodulated signal to predetermined values which are sufficiently strong to drive a voltage comparator 1223, from which the undecoded data stream is generated at TTL voltage levels.

Microcontroller 39 then decodes and verifies the data stream so that it is identical to that being transmitted, and rejects all other unwanted or arbitrary signals. Well known error detection and correction techniques may be used to accomplish this function (e.g. CRC codes, CHKSUM, etc.) The reference voltage for comparator 1223 (i.e. auto-adjustable threshold) is continuously adjusted by the microcontroller 39 according to the level of the signal relative to background noise level.

As discussed in greater detail below, microcontroller 39 operates in conjunction with the tuning network of inductors 31-35 and microswitch array 37 (FIG. 2) to lock the centre operating frequency of signal reception.

A quench oscillator 1225 provides the necessary QUENCH frequency signal to the feed-back circuit of amplifier 1215.

Turning now to FIGS. 9-12 in combination with FIGS. 1 and 2, a detailed description is provided of the adaptive self-tuning aspect of the present invention.

When data terminal 1 wishes to transmit information to data terminal 7, an RS-232 control signal RTS (request to send) is transmitted to transceiver 3 via the asynchronous serial communication link therebetween. Microcontroller 39 within transceiver 3 then causes the transmit portion of the transceiver to generate and transmit n identical test sequences. The predefined test sequence is stored in both transceivers 3 and 9 and is used to tune transceiver 9 to an optimal center operating frequency for the transmit carrier frequency of transceiver 3 (see FIG. 9).

Transceiver 9 receives the transmitted test sequences from transceiver 3 (referred as RTEST 1, RTEST 2, ... RTEST n in FIG. 9) and compares each of the received test sequences with the original stored test sequence (TEST=TEST 1=TEST 2=... TEST n) stored within microcontroller 39 of transceiver 9. More particularly, upon receipt of the first test sequence (TEST 1), the microcontroller 39 in transceiver 9 compares the received test sequence RTEST 1 with the stored TEST 1 sequence for a first predetermined state of the microswitch array 37 under operation of microcontroller 39. Microcontroller 39 then counts the number of bit errors for that particular state of the tuning impedance array. The number of errors and the state of the array 37 (referred to herein as MSA 37) are stored in memory of the microcontroller for creating a tuning table (FIG. 10).

Before the second test sequence is received, microcontroller 39 changes the state of MSA 37 to provide a different selection of inductors 31-35 in parallel with inductor 27, thereby slightly changing the receiver center operating frequency. Microcontroller 39 then compares the received test signal RTEST2 with the original test sequence TEST2, counts the number of bit errors for the new state (M2) of MSA 37 and stores the MSA state M2 and the number of bit errors (E2) in the internal tuning table (FIG. 10).

This procedure is repeated for all possible states of MSA 37 (i.e. n different values of inductivity in parallel with the main wire wound inductor coil 27). The resulting tuning table of FIG. 10 contains all n states of MSA 37 (M1, M2, ..., Mn) and the corresponding numbers of bit errors (E1, E2, ..., En), wherein each state of MSA 37 defines a discrete centre operating frequency of transceiver 9.

Microcontroller 39 then reviews the tuning table to ascertain which of the states of MSA 37 provides the least number of bit errors. Clearly, this state corresponds to the optimal receive center operating frequency to the transmit carrier frequency generated by transceiver 3. Once the optimum configuration of MSA 37 has been selected at the end of the generated test sequence, transceiver 3 transmits a clear to send (CTS) signal to data terminal 1 in response to which data terminal 1 begins transmission of the actual information data package for reception by the transceiver 9 and data terminal 7.

Figure 11:
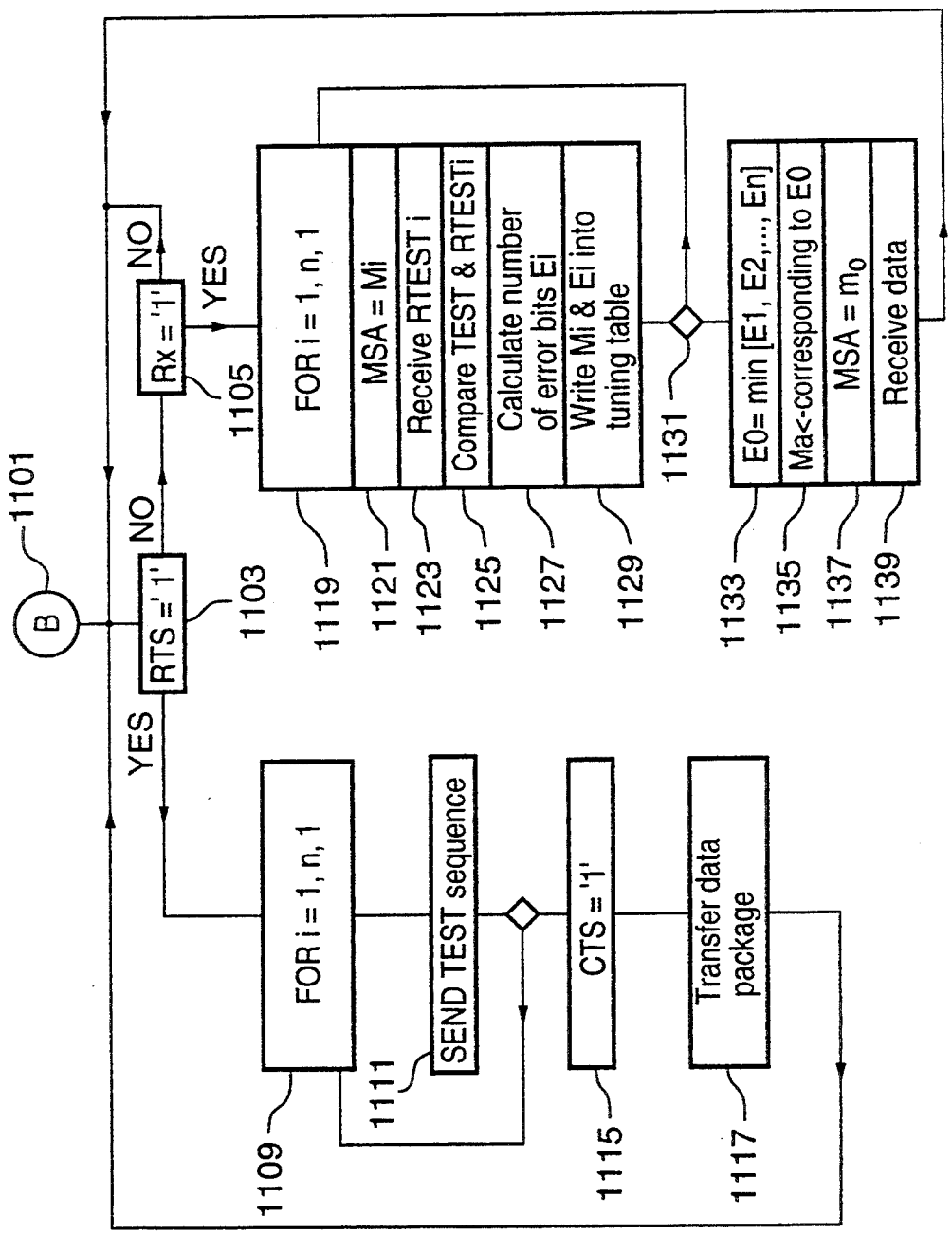
FIG. 11 is flow chart showing operation of the system according to the present invention.

FIG. 11 is a flow chart illustrating the steps discussed above for adaptive self-tuning of the receiver portion of transceiver 9 to match the transmit carrier frequency of transceiver 3. Microcontroller 39 begins operation at step 1101 and executes an idle loop for polling the RS-232 input pin connected to the RTS control signal from data terminal i (step 1103). If RTS is not at a logic high, the microcontroller 39 polls the input pin connected to the receiver portion of the transceiver in order to determine whether data is being received from a remote transceiver (i.e. the start bit is detected at the receiver output: $R_x$="1"). If both the RTS control signal and the start bit detected at the receiver output ($R_x$) are at logic low levels, then microcontroller 39 continues in the idle loop.

As discussed above, in the event that a data terminal wishes to send a data packet, it raises the RTS voltage to a logic high value. Microcontroller 39 detects a logic high value at step 1103 and begins a transmit subroutine comprising steps 1109 to 1117. In the transmit subroutine, microcontroller 39 modulates the transmitter portion of the transceiver with the above-discussed test sequence n times (i.e. by executing the FOR loop provided by steps 1109, 1111 and 1113). After that, microcontroller 39 raises the CTS signal (step 1115) to let the data terminal know that transmission of data information packages can begin. Finally, microcontroller 39 transfers the data package (step 1117) to the transceiver for transmission.

If a signal is detected in the receiver portion of the transceiver (i.e. $R_x$="1" in step 1105), then a receive subroutine is executed comprising steps 1119 to 1139. At step 1119, a FOR loop is executed in which microcontroller 39 defines the first state of MSA 37 (i.e. MSA=M1 which designates a specific combination of chip inductors 31-35 for defining a first receiver center operating frequency), and receives the first test sequence (step 1123). At step 1125, the stored test sequence (TEST 1) and the received test sequence (RTEST 1) are compared for transmission errors, the number of bit errors bits (E1) is calculated (step 1127), and M1 and E1 are written to the tuning table of FIG. 10 (step 1129) within microcontroller 39. The same procedure is repeated in the next loop iteration and as a result the second state of MSA 37 (M2) and the corresponding number of errors (E2) (i.e. the difference between RTEST2 and TEST sequences) is written to the tuning table.

Once all n states have been processed (i.e. at the end of the FOR loop comprising steps 1119 to 1131), the minimum bit error value Ea-min [E1, E2, ..., En] is located in the tuning table and the corresponding state of MSA 37 is determined (steps 1133 and 1135). This state of MSA 37 is selected as the operating state (Mo)

in step 1137 and thereby defines the receiver centre operating frequency which is optimally tuned to the remote transmit carrier frequency. Finally, the data package is received (step 1139). Once the data package has been received, microcontroller 39 reverts to the idle loop defined by steps 1103 and 1105.

Figure 3:
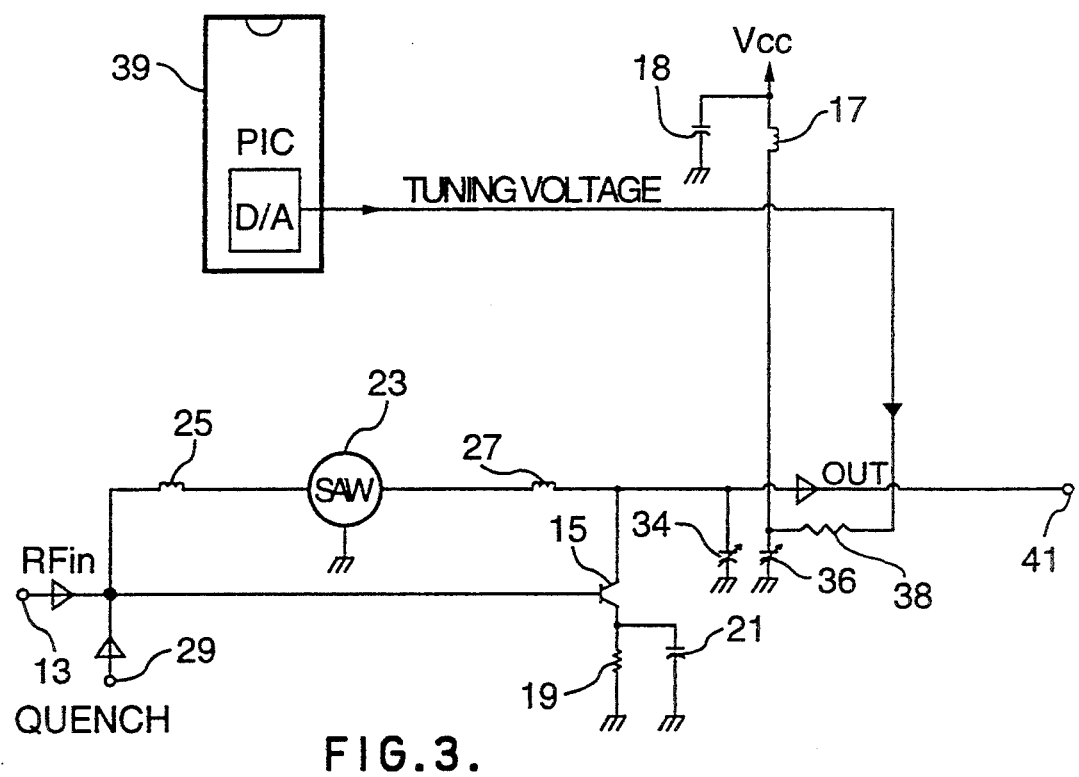
FIG. 3 is a block schematic diagram of a capacitive adjustable configuration of the receiver according to a second embodiment of the invention.

Although the preferred embodiment has been described with reference to an impedance tuning network comprised of a plurality of inductors 31–35 connected to the switch array 37, the principles of the present invention apply equally well in tuning the receiver center operating frequency via an adjustable capacitance, as shown in FIG. 3. A capacitor 34 is connected to the collector terminal of transistor 15 for providing a temperature compensating element to compensate for drift incurred by the transistor. A variable capacitor 36 (e.g. a varactor diode) is also connected to the collector terminal of transistor 15 in parallel with temperature compensating capacitor 34. A tuning voltage is generated by means of an internal digital-to-analogue converter within microcontroller 39, and is applied to varactor diode 36 via a current limiting resistor 38. The capacitance of varactor diode 36 changes in response to the current applied thereto. Thus, by increasing or decreasing the tuning voltage at the input of resistor 38, the current through the varactor diode changes, thereby causing the receiver centre operating frequency to change. Thus, the difference in the embodiment of FIG. 3 from that shown in FIG. 2 is that instead of providing n different states of MSA 37, the receiver center operating frequency is defined by the tuning voltage applied to varactor diode 36. This voltage is controlled by microcontroller 39 for defining n different analogue values to create a tuning table with n pairs of control voltages and a corresponding number of bit errors (each control or tuning voltage determines a capacitance of varactor diode 36, and thereby adjusts the receiver centre operating frequency).

In addition to the capacitive adjustable configuration of FIG. 3, various other configurations are possible for providing n different tuning impedances in the receive portion of the transceiver. Precisely the same methodology is utilized for generating test sequence bytes, receiving and comparing the test sequence bytes with the stored predefined sequence of test bytes, creating a tuning table and determining the appropriate impedance for an optimal match between the receiver centre operating frequency and the remote transmitter carrier frequency, in each of the embodiments illustrated in FIGS. 4–8.

Figure 4:
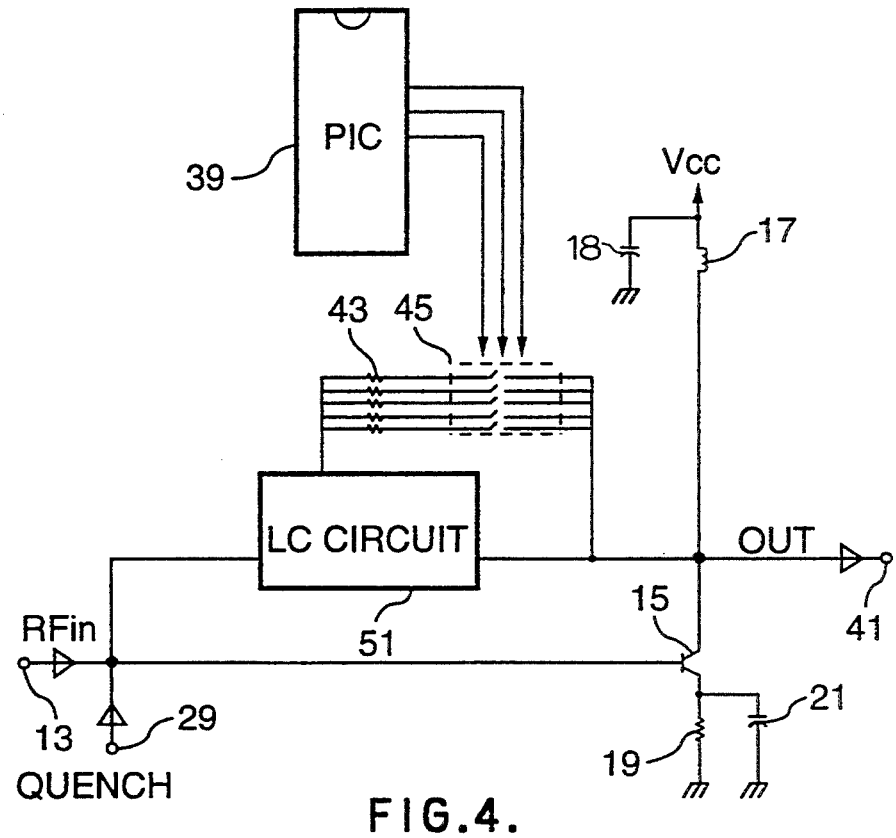
FIG. 4 is a block schematic diagram of a resistive adjustable configuration according to a third embodiment of the invention.

In FIG. 4, the receiver tuning impedance is selected utilizing an LC circuit in combination with a plurality of resistors 43 connected in parallel with LC circuit 41 to a switch array 45 (similar to switch array 37 in FIG. 2).

For ease of illustration, in FIGS. 5–8, the details of the superegenerative oscillator (inputs 13, 29, inductors 25, 27, SAW device 23, transistor 15, resistor 19, capacitor 21, capacitor C1, inductor 17, source of voltage Vcc and output terminal 41) are replaced by oscillator blocks 51, 61, 71 and 81, respectively.

Figure 5:
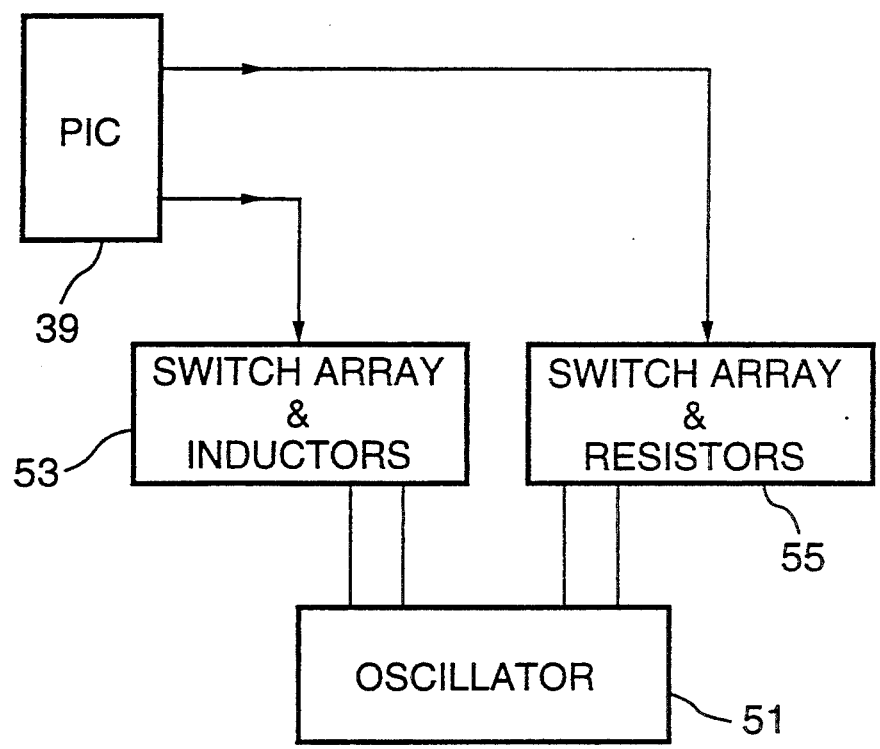
FIG. 5 is a block diagram showing an inductive/resistive adjustable configuration of the receiver according to a fourth embodiment of the invention.

In FIG. 5, switch array and inductors block 53 corresponds to inductors 31–35 and an MSA 37 in FIG. 2, and the switch array and resistors block 55 corresponds to resistors 43 and MSA 45 in FIG. 4. Thus, the inductive/resistive configuration of FIG. 5 utilizes a combination of inductors and resistors to provide the appropriate tuning impedance, with blocks 53 and 55 operating under control of microcontroller 39.

Figure 6:
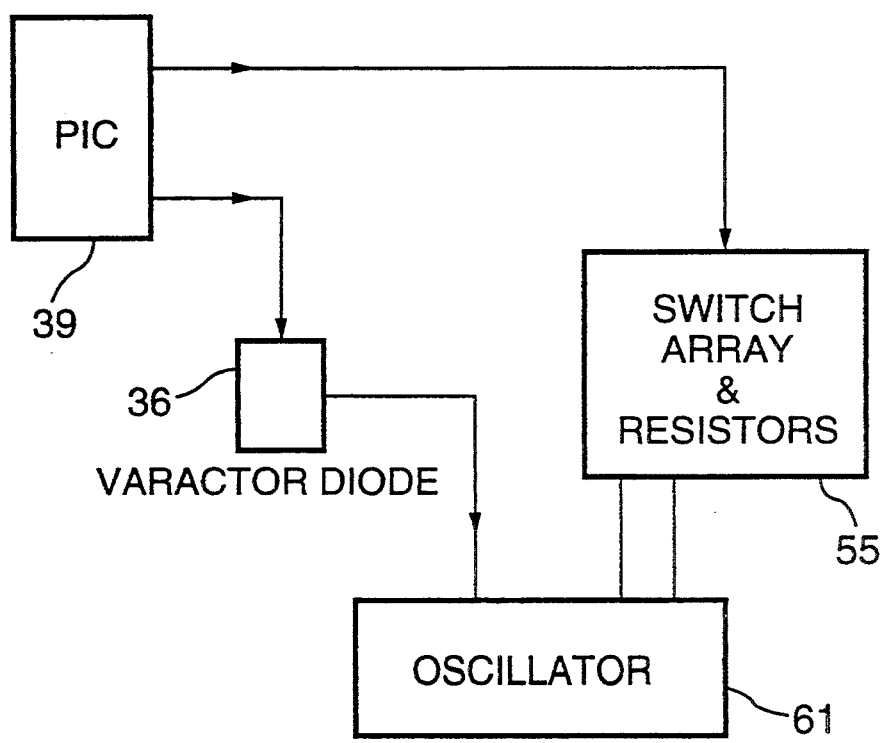
FIG. 6 is a block diagram showing a capacitive/resistive configuration of the receiver according to a fifth embodiment of the invention.

Similarly, the capacitive/resistive configuration of FIG. 6 utilizes a switch array and resistors block 55 in combination with varactor diode 36 to provide an appropriate tuning impedance under control of microcontroller 39.

Figure 7:
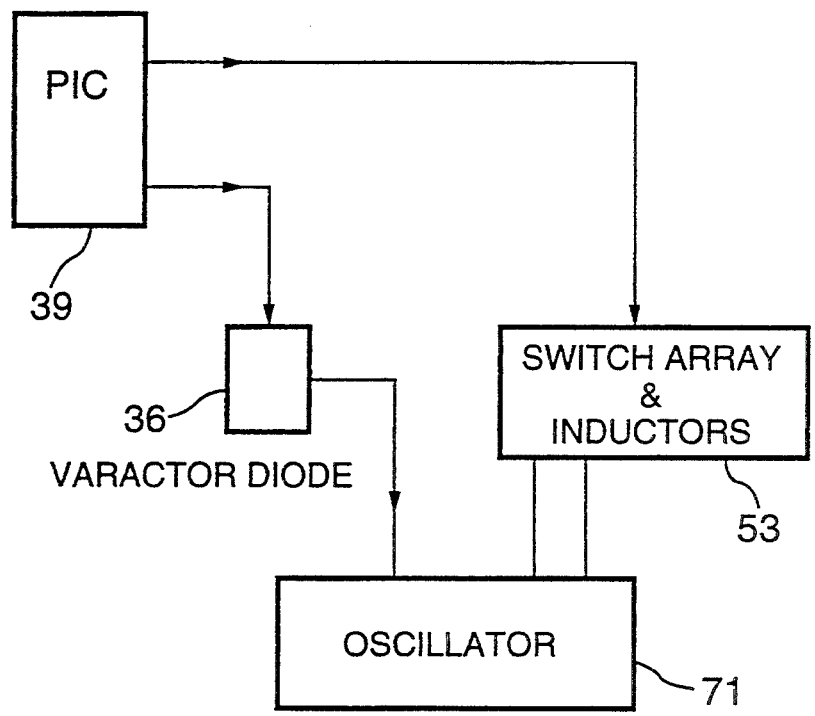
FIG. 7 is a block diagram showing an inductive/capacitive adjustable configuration of the receiver according to a sixth embodiment of the invention.
Figure 8:
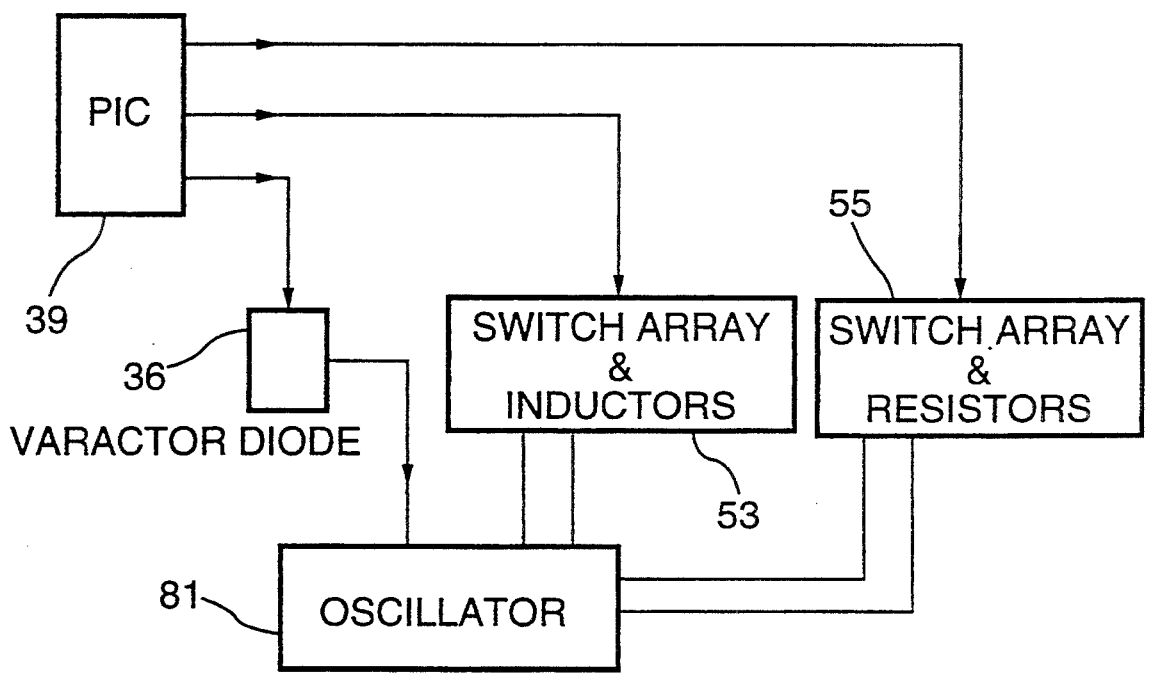
FIG. 8 is a block diagram showing an inductive/capacitive/resistive adjustable configuration of the receiver according to a seventh embodiment of the invention.

Finally, FIGS. 7 and 8 illustrate a combination of varactor diode 36 and switch array and inductors block 53, and a combination of varactor diode 36, switch array and inductors block 53 and switch array and resistors block 55, respectively, for setting the appropriate receive centre under operating frequency control of microcontroller 39. The switch array and inductor block 53 corresponds to inductors 31–35 and MSA 37 as shown in FIG. 2, while the switch array and resistor block 55 corresponds to resistors 43 and MSA 45 as shown in FIG. 4.

Other embodiments and modifications of the invention are possible. For example, although in the preferred embodiment an identical arrangement of bitts is used for each test sequence (i.e. TEST=TEST 1=TEST 2=... . TEST n), it is contemplated that each test sequence may incorporate a different bit arrangement, provided that the identical test sequences are stored in both transceivers 3 and 9.

Although such embodiments and modifications are within the sphere and scope of the claims appended hereto.

I claim:

1. In a transmitter for transmitting an information signal on a predetermined carrier frequency and a receiver for receiving said information signal, an adaptive system for self-tuning said receiver relative to said predetermined carrier signal, comprising:
   a) means within said receiver for storing a predetermined number of test sequences;
   b) means within said transmitter for generating and transmitting identical versions of said predetermined test sequences at said predetermined carrier frequency prior to transmitting said information signal;
   c) means within said receiver for selecting respective ones of a predetermined number of tuning impedances for tuning said receiver to receive respective ones of said test sequences, transmitted by said transmitter, at respective center operating frequencies set by said tuning impedances; and
   d) means within said receiver for comparing said test sequences received at said respective centre operating frequencies with said test sequences stored within said receiver, determining which one of said tuning impedances results in a least mismatch between said received test sequences and said stored test sequences, and selecting said one of said tuning impedances for receiving said information signal at an associated one of said centre operating frequencies which is optimally matched with said predetermined carrier frequency.

2. The system of claim 1 wherein said means within said receiver for selecting respective ones of said tuning impedances comprises a plurality of inductors connected in parallel to a switch array.

3. The system of claim 1 wherein said means within said receiver for selecting respective ones of said tuning impedances comprises a voltage-controlled varactor diode.

4. The system of claim 1 wherein said means within said receiver for selecting respective ones of said tuning impedances comprises an LC circuit in parallel with a plurality of resistors which are connected in parallel to a switch array.

5. The system of claim 1 wherein said means within said receiver for selecting respective ones of said tuning impedances comprises a plurality of inductors connected in parallel to a first switch array in combination with a plurality of resistors connected in parallel to a second switch array.

6. The system of claim 1 wherein said means within said receiver for selecting respective ones of said tuning impedances comprises a voltage-controlled varactor diode in combination with a plurality of resistors which are connected in parallel to a switch array.

7. The system of claim 1 wherein said means within said receiver for selecting respective ones of said tuning impedances comprises a voltage-controlled varactor diode in combination with a plurality of inductors connected in parallel to a switch array.

8. The system of claim 1 wherein said means within said receiver for selecting respective ones of said tuning impedances comprises a voltage-controlled varactor diode in combination with a plurality of resistors which are connected in parallel to a first switch array and a plurality of inductors connected in parallel to a second switch array.

9. In a transmitter for transmitting an information signal on a predetermined carrier frequency and a receiver for receiving said information signal, a method for self tuning said receiver relative to said predetermined carrier signal, comprising the steps of:
   a) storing within said receiver a predetermined number of test sequences;
   b) generating within said transmitter and transmitting identical versions of said predetermined test sequences at said predetermined carrier frequency prior to transmitting said information signal;
   c) selecting within said receiver respective ones of a predetermined number of tuning impedances for tuning said receiver to receive respective ones of said test sequences, transmitted by said transmitter, at respective center operating frequencies set by said tuning impedances; and
   d) comparing within said receiver said test sequences received at said respective centre operating frequencies with said test sequences stored within said receiver, determining which one of said tuning impedances results in a least mis-match between said received test sequences and said stored test sequences, and in response selecting said one of said tuning impedances for receiving said information signal at an associated one of said centre operating frequencies which is optimally matched with said predetermined carrier frequency.

* * * * *